(12) United States Patent
Nakayama

(10) Patent No.: US 7,589,544 B2
(45) Date of Patent: Sep. 15, 2009

(54) PROBE TEST APPARATUS

(75) Inventor: Hiroyuki Nakayama, Kumamoto (JP)

(73) Assignee: NEC Electroncis Corporation, Kanagawa (JP)

( * ) Notice: Subject to any disclaimer, the term of this patent is extended or adjusted under 35 U.S.C. 154(b) by 1 day.

(21) Appl. No.: 11/634,257

(22) Filed: Dec. 6, 2006

(65) Prior Publication Data
US 2007/0132468 A1 Jun. 14, 2007

(30) Foreign Application Priority Data

Dec. 9, 2005 (JP) ............................. 2005-356852
Oct. 5, 2006 (JP) ............................. 2006-274180

(51) Int. Cl.
*G01R 31/02* (2006.01)
(52) U.S. Cl. ...................................... 324/758; 324/754
(58) Field of Classification Search .................... None
See application file for complete search history.

(56) References Cited

U.S. PATENT DOCUMENTS

| | | | | |
|---|---|---|---|---|
| 4,899,921 A | * | 2/1990 | Bendat et al. ................ 228/105 |
| 4,929,893 A | * | 5/1990 | Sato et al. .................... 324/758 |
| 5,321,352 A | * | 6/1994 | Takebuchi .................... 324/758 |
| 5,404,111 A | * | 4/1995 | Mori et al. .................... 324/758 |
| 5,561,386 A | * | 10/1996 | Funaki et al. ................ 324/758 |
| 5,585,738 A | * | 12/1996 | Kuji et al. .................... 324/754 |
| 5,642,432 A | * | 6/1997 | Mori ............................ 382/145 |
| 5,777,485 A | * | 7/1998 | Tanaka et al. ................ 324/757 |
| 6,002,426 A | * | 12/1999 | Back et al. .................... 348/87 |
| 6,088,474 A | * | 7/2000 | Dudasko et al. ............. 382/145 |
| 6,906,546 B2 | * | 6/2005 | Tanioka et al. .............. 324/765 |
| 6,917,698 B2 | * | 7/2005 | Obi ............................... 382/151 |
| 2003/0025517 A1 | * | 2/2003 | Kiest et al. .................... 324/758 |

FOREIGN PATENT DOCUMENTS

| JP | 05-166891 | 7/1993 |
|---|---|---|
| JP | 08-037211 | 2/1996 |
| JP | 2004-063877 | 2/2004 |

* cited by examiner

*Primary Examiner*—Paresh Patel
(74) *Attorney, Agent, or Firm*—Young & Thompson

(57) ABSTRACT

The present invention provides a probe test apparatus capable of easily correcting a probe needle of a probe card. A pad image by which the position of an electrode pad P can be specified is captured from a semiconductor wafer, and the captured pad image is stored. While capturing a probe image by which the position of the tip Q of a probe needle can be specified from a probe card, the probe image is displayed while being overlaid on the inverted pad image in a real time manner. Since the positional relation of the probe needle with respect to the electrode pad P is displayed in a real time manner, at the time of correcting a probe needle with tweezers or the like with reference to the image, the operator can correct the probe needle while observing the state of the probe needle in a real time manner.

6 Claims, 14 Drawing Sheets

——— STORED DATA
------- CORRECTION DATA

PROBE TEST APPARATUS

This application is based on Japanese Patent application NOS. 2005-356852 and 2006-274180, the contents of which are incorporated hereinto by reference.

BACKGROUND

1. Technical Field

The present invention relates to a probe test apparatus used for supporting a work of correcting a probe needle of a probe card.

2. Related Art

Hitherto, in order to test electric characteristics of a semiconductor device formed on the surface of a semiconductor wafer, a combination of an LSI (Large Scale Integration) tester and a probe device is used. Usually, a number of semiconductor devices are arranged and formed on the surface of a semiconductor wafer to be tested, and a number of electrode pads are formed in a predetermined pattern on the surface of each of the semiconductor devices.

In order to electrically test a semiconductor device on the surface of a semiconductor wafer, a plurality of electrode pads have to be brought into conduction at once. A test jig called a probe card is mounted in the probe device to bring predetermined electrode pads of semiconductor devices on the surface of a semiconductor wafer into conduction at once. In the probe card, a number of probe needles are arranged in correspondence with predetermined arrangement of electrode pads of the semiconductor devices on the surface of the semiconductor wafer. Consequently, the probe needles correspond to necessary electrode pads of the semiconductor devices on the surface of the semiconductor wafer in a one-to-one correspondence manner.

However, in the case where handling, repairing state, or the like of the probe card is bad, the tip position of the probe needle may be deviated from a normal position. In this case, the deviated tip of the probe needle does not come into contact with the proper position of the corresponding electrode pad of the semiconductor device, so that a test of the electric characteristics cannot be normally conducted.

Consequently, at the time of testing electric characteristics of a semiconductor device on the surface of the semiconductor wafer by a probe device, the tip of the probe needle is pressed against an electrode pad of a semiconductor device to form a needle mark. The electrode pad of the semiconductor device is observed with a microscope to check whether the needle mark is formed in a proper position or not. In this case, if the position of the needle mark is proper, a test of the electric characteristics is started. However, if the position of the needle mark is not proper, the probe card has to be corrected.

For example, in the case where a needle mark is formed in a position out of an electrode pad range or, in a position at a corner even when it is in the electrode pad range, first, the position of the probe needle whose position shifts is recorded on a dedicated recording sheet. The probe card having the positional shift is corrected on the basis of the recording sheet.

However, in recent years, as semiconductor devices are becoming finer and packing density is becoming higher, the area of an electrode pad and the interval of electrode pads are decreasing. With the decrease, the probe needle is becoming thinner, the interval of probe needles is narrowing, and the number of probe needles is increasing, so that it is difficult to correct a probe needle.

A probe needle is corrected by, for example, a form in which a company for testing electric characteristics of a semiconductor device on the surface of a semiconductor wafer entrusts the correction to an external company specializing in testing. At this time, the probe card is given together with the recording sheet to the external company, and the probe card whose positional shift is corrected by the external company is received. After reception of the probe card, a needle mark test is carried out again.

A probe test apparatus as a first conventional technique will be described hereinbelow with reference to FIGS. 8 to 10. FIG. 8 is a front view showing the appearance of the whole probe test apparatus. FIG. 9 is a schematic view showing an assembly structure of a main portion of the probe test apparatus. FIG. 10 is a front view showing a display image of a needle point. In the probe test apparatus shown in FIG. 8, the main parts shown in FIG. 9 are housed in a body cover 43.

In the probe test apparatus of a first conventional technique, a probe needle 37 of a probe card 36 is pressed against a transparent glass plate 34. An image of a needle point is recognized by a needle point observing apparatus made by an optical microscope 38 and a CCD (Charge Coupled Device) camera 39. The image data is pattern-processed and, after that, the resultant data is displayed on a CRT (Cathode-Ray Tube) display 47.

At this time, by arbitrarily switching display images between a front (needle point) image and a back-side (electrode pad) image in accordance with the orientation of the probe card 36, for example, an image and the probe needle 37 of the probe card 36 are aligned at the time of rectifying a needle point.

In the case of testing the probe card 36 by the probe test apparatus, first, the probe needle 37 of the probe card 36 is set to face downward and a needle point image of each probe needle 37 is processed and stored by a computer as shown in FIG. 10. Next, in the case of correcting the probe needle 37, as shown in FIG. 8, a holder 35 in which the probe card 36 is mounted is inversely turned in the direction of the arrow C by 180 degrees, and correcting process is performed so that the probe needle 37 faces upward (refer to, for example, Japanese Laid-open patent publication NO. 5-166891).

A second conventional technique will now be described hereinbelow with reference to FIGS. 11 and 12. FIG. 11 is a schematic front view of an entire probe test apparatus. FIG. 12 is a front view showing a display image of needle points.

The probe test apparatus of the second conventional technique is used to perform alignment for making the probe needle 37 of the probe card 36 properly come into contact with an electrode pad of a semiconductor device on a semiconductor wafer in a system (not shown) for testing electric characteristics of a semiconductor device formed on the surface of a semiconductor wafer.

In the system for testing the electric characteristics, a semiconductor wafer is disposed so that a semiconductor device is positioned on the top face and the probe card 36 is disposed so that the probe needle 37 is positioned on the under face. Consequently, the probe test apparatus of the second conventional technique has the structure of capturing an image of the probe needle 37 of the probe card 36 by a camera 14 from below. An image of electrode pads of the semiconductor device formed on the surface of the semiconductor wafer is stored in advance. As shown in FIG. 12, the image of the probe needles 37 captured by the camera 14 is displayed so as to be overlaid on the image of the electric pads.

By adjusting the position of a wafer stage 15 so that the tip of the probe needle 37 is properly positioned on the electrode pad in the image, the tip of the probe needle 37 properly come into contact with an electrode pad of the semiconductor device of the semiconductor wafer (not shown) held by the wafer stage 15 (refer to, for example, Japanese Laid-open patent publication NO. 8-37211).

Next, a third conventional technique will be described with reference to FIG. 13 and FIGS. 14A and 14B. FIG. 13 is a schematic diagram showing an entire probe test apparatus. FIGS. 14A and 14B are front views each showing a display image of a needle point.

In a manner similar to the second conventional technique, the probe test apparatus of the third conventional technique is used to perform alignment for making the probe needle 37 of the probe card 36 properly come into contact with an electrode pad of a semiconductor device in a system (not shown) for testing electric characteristics of a semiconductor device formed on the surface of a semiconductor wafer.

Consequently, the probe test apparatus of the third conventional technique also has the structure of holding the probe card 36 in a state where the probe needle 37 is positioned below. In the probe test apparatus, the probe needle 37 of the probe card 36 is pressed against an electrode pad 10a of a semiconductor wafer 10, an image of the electrode pad 10a is captured by a color camera 8 and, as shown in FIG. 13, an image of a needle mark is displayed on a display 11.

Since a cross-shaped pointer is also displayed on the display 11, the pointer is moved to the center of the needle mark, and the position data is registered. By controlling the position of the wafer stage 15 in accordance with the position data, the tip of the probe needle 37 comes into contact with the electrode pad 10a of the semiconductor device on the semiconductor wafer 10 (refer to, for example, Japanese Laid-open patent publication NO. 2004-63877).

SUMMARY OF THE INVENTION

In the probe test apparatus of the first conventional technique, an image of the probe needle 37 is not displayed in a real-time manner at the time of performing the correcting work. Consequently, if the probe needle 37 is corrected with tweezers by referring to an image, it is necessary to repeat the operations of resetting the holder 35 after completion of the correcting work, capturing all of the images of the probe needle 37, and recognizing the degree of correction until the correction is properly finished.

The probe test apparatuses of the second and third conventional techniques are used for alignment between the electrode pad of the semiconductor device on the semiconductor wafer and the probe needle 37 of the probe card 36. The probe card 36 is disposed so that the probe needle 37 is positioned in the under face, so that it is difficult to correct the probe needle 37 with tweezers or the like in this state.

Moreover, in the probe test apparatus of the second conventional technique, one entire semiconductor device is displayed on the screen for alignment, so that images of electrode pads and the probe needles 37 are displayed small. Consequently, if the probe needle 37 is corrected with tweezers with referring to the image, the work is very difficult.

In the probe test apparatus of the third conventional technique, only the image of the electrode pad 10a on which the needle mark is formed by the probe needle 37 is displayed on the screen, and the probe needle 37 is not displayed on the screen. Consequently, even if the probe needle 37 is corrected with tweezers with reference to the image, the probe needle 37 cannot be corrected while observing the state of the probe needle 37 in a real time manner.

The present invention has been achieved in consideration of the problems and an object of the invention is to provide a probe test apparatus capable of easily correcting a probe needle of a probe card.

According to the present invention, there is provided a probe test apparatus including: a pad layout image storing unit, a card holding unit, a probe image capturing unit, and an image processing unit. The pad layout image storing unit sets and stores a pad layout image. The card holding unit holds a probe card having a surface on which probe needles are arranged in a state where the probe needles are positioned upward. The probe image capturing unit captures a probe image, in a real time manner, by which position of the tip of each of the probe needles can be specified from the probe card held. The image processing unit displays the probe image and the pad layout image which are overlaid in the same direction. Consequently, the positional relation with respect to the electrode pad of the probe needle positioned on the top face of the probe card is displayed.

Each of the various units in the present invention may be formed so as to realize its function, and realized by, for example, dedicated hardware offering a predetermined function, a computer to which a predetermined function is given by a computer program, a predetermined function realized in the computer by a computer program, an arbitrary combination of them, or the like.

Each of various components of the present invention does not have to be an independent one. A plurality of components maybe formed as a single member. One component may be formed by a plurality of members. A component may be a part of another component. A part of a component may also serve as a part of another component.

Since the probe image captured in a real time manner is displayed so as to be overlaid on a pad layout image stored in advance, an operator can perform a correcting operation while observing the state of the probe needle with respect to the electrode pad in a real time manner.

In the probe test apparatus of the present invention, a probe card is held in a state where probe needles are positioned upward. A probe image captured in a real time manner is displayed so as to be overlaid on the pad layout image in a real time manner, thereby displaying the positional relation of the probe needle positioned on the top face of the probe card to the electrode pad in a real time manner. Consequently, at the time of correcting a probe needle with tweezers or the like with reference to an image, the operator can correct the probe needle while observing the state of the probe needle in a real time manner. Thus, the work can be facilitated.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described hereinbelow with reference to the drawings.

FIRST EMBODIMENT

Figure 1A:
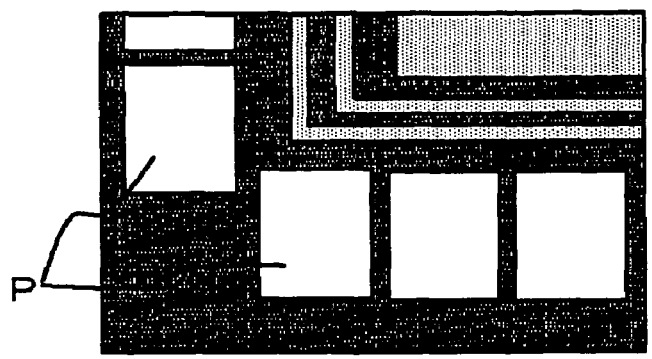
FIGS. 1A to 1D are schematic front views showing display images of a probe test apparatus of a first embodiment.
Figure 2:
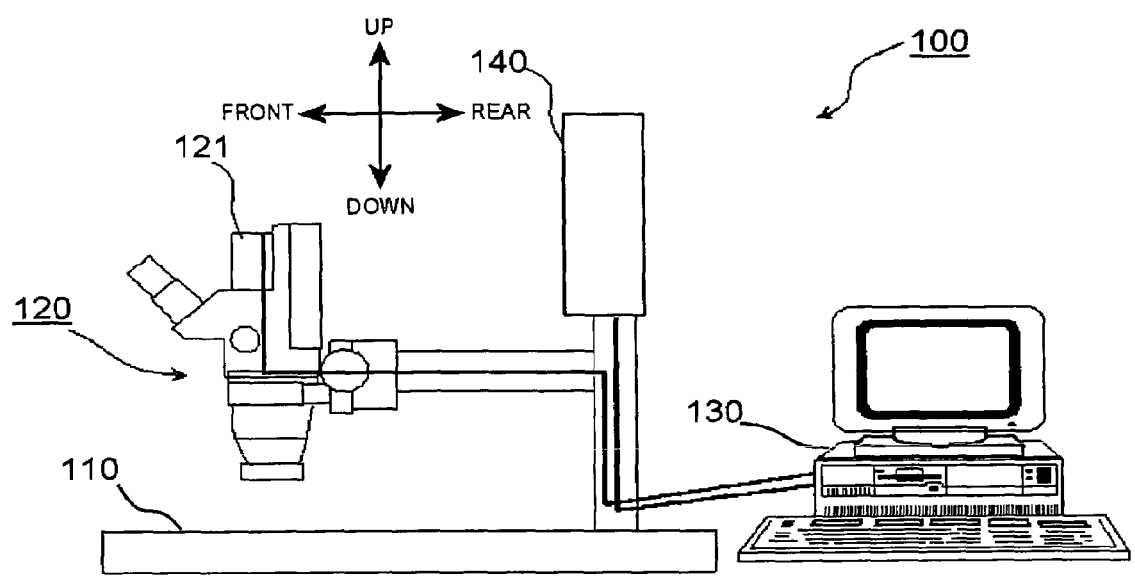
FIG. 2 is a schematic side view showing the structure of the probe test apparatus.
Figure 3:
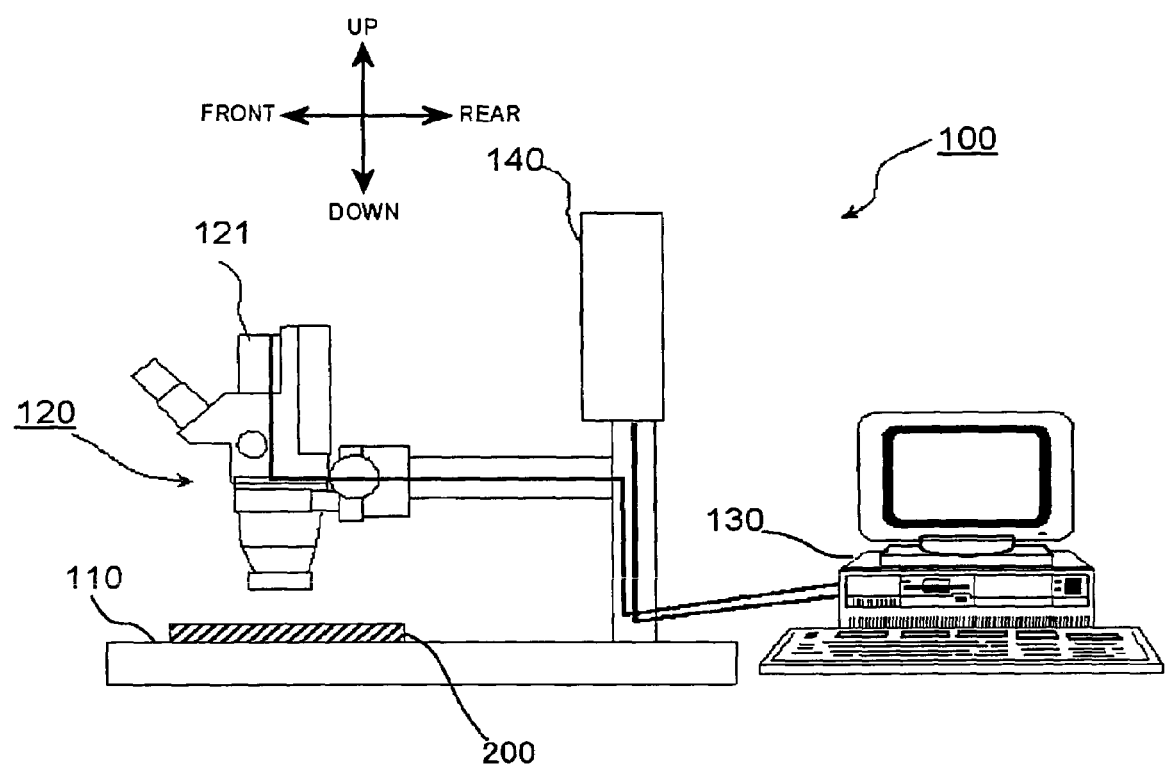
FIG. 3 is a schematic side view showing a state where a semiconductor wafer is set in the probe test apparatus.
Figure 4:
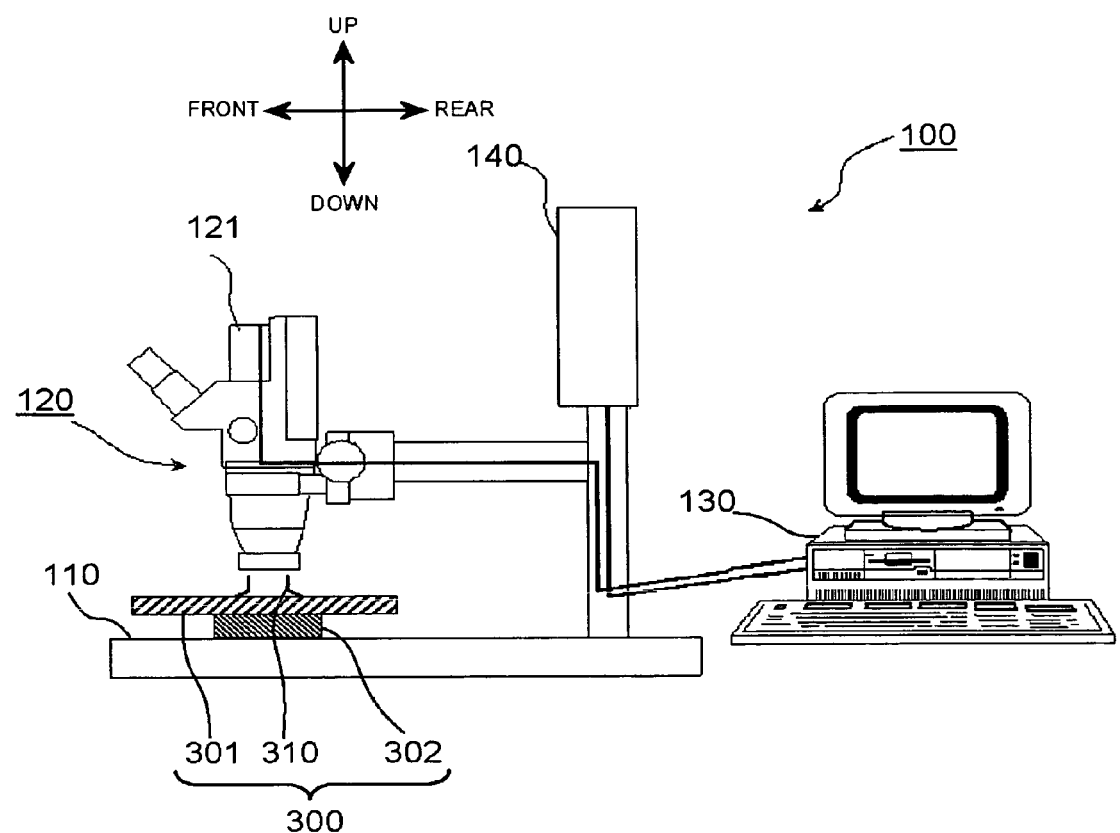
FIG. 4 is a schematic side view showing a state where a probe card is set in the probe test apparatus.
Figure 5:
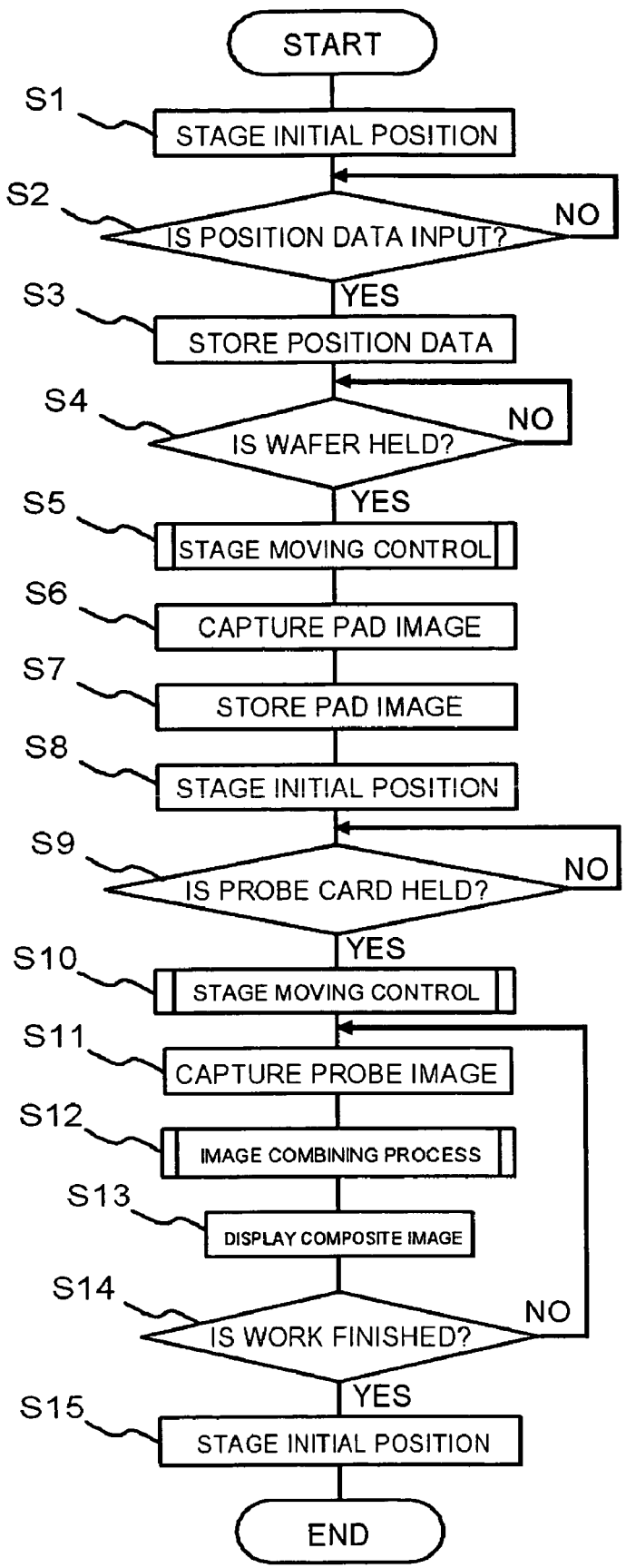
FIG. 5 is a flowchart showing processing operation of the probe test apparatus.

A first embodiment of the present invention will be described with reference to FIG. 1A to FIG. 5. FIGS. 1A to 1D are schematic front views showing display images of a probe test apparatus of the embodiment. FIG. 2 is a schematic side view showing the structure of the probe test apparatus. FIG. 3 is a schematic side view showing a state where a semiconductor wafer is set in the probe test apparatus. FIG. 4 is a schematic side view showing a state where a probe card is set in the probe test apparatus. FIG. 5 is a flowchart showing processing operation of the probe test apparatus. Although the embodiment will be described with specified front, back, right, left, up, and down directions, the directions are specified for simply describing the relative relations of components and do not limit the directions at the time of manufacturing and use in the case of carrying out the invention.

A probe test apparatus 100 of the embodiment has, as shown in FIGS. 2 to 4, an X/Y stage 110 functioning as wafer holding unit, card holding unit, wafer moving unit, and card moving unit. By the X/Y stage 110, a semiconductor wafer 200 and a probe card 300 are held and moved.

More specifically, a number of semiconductor devices are arranged and formed on the surface of the semiconductor wafer 200. As shown in FIG. 1A, on the semiconductor device, a plurality of electrode pads P are formed respectively on the surface in predetermined layout. The X/Y stage 110 holds the semiconductor wafer 200 in a state where the semiconductor device is positioned on the top face, and moves the semiconductor wafer 200 back and forth and side to side in parallel with the top face of the X/Y stage 110.

Since things necessary for a test of electric characteristics are specified in the electrode pad P of the semiconductor device on the surface of the semiconductor wafer, in the probe card 300, a number of probe needles 310 are arranged in positions so as to come into contact with the electrode pads P used for a test as shown in FIG. 4. The probe needles 310 stand on the surface of the insulating substrate 301 and are connected to a interconnect pattern (not shown) formed on the surface of an insulating substrate 301.

A metal plate 302 serving as a reinforcement member and a heat discharge plate is bonded to the back side of the insulating substrate 301 of the probe card 300. The X/Y stage 110 holds the probe card 300 in a state where the probe needle 310 is positioned upward, and moves the probe card 300 back and force and side to side in parallel with the top face of the X/Y stage 110.

An optical microscope 120 is disposed in a position facing, from above, the semiconductor wafer 200 and the probe card 300 held on the X/Y stage 110. In the optical microscope 120, a CCD camera 121 as an image capturing device functioning as a wafer image capturing unit and a probe image capturing unit is assembled.

Figure 1B:
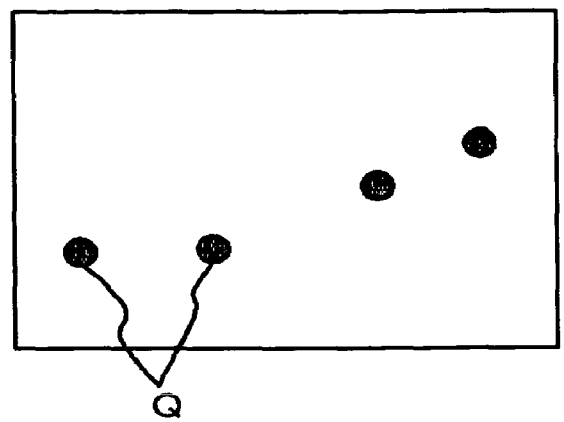

The CCD camera 121 captures a pad image by which the positions of the electrode pads P can be specified as shown in FIG. 1A from the semiconductor wafer 200 held on the X/Y stage 110, and captures a probe image by which the positions of tips Q of probe needles 310 can be specified as show in FIG. 1B from the probe card 300 held on the X/Y stage 110.

Since the CCD camera 121 is assembled in the optical microscope 120 as described above, the surface of the semiconductor wafer 200 and the probe card 300 is partially enlarged and its image is captured. Since the X/Y stage 110 moves the semiconductor wafer 200 and the probe card 300 back and forth and side to side as described above, by the movement, the entire surface of the semiconductor wafer 200 and the probe card 300 lies in an image capture range.

A computer 130 is connected to the CCD camera 121, and a display unit 140 is connected to the computer 130. The computer 130 is a so-called personal computer and operates in correspondence with a computer program installed, thereby functioning as position input unit, movement control unit, and image storing unit.

More concretely, in the case of using the probe test apparatus 100 of the embodiment, as will be described in detail hereinlater, position data of a portion in which the probe needle 310 does not properly come into contact with the electrode pad P is input to the computer 130 by keyboard operation or the like. The computer 130 controls the operation of the X/Y stage 110 in correspondence with the input position data, so that a portion in which the probe needle 310 did not properly come into contact with the electrode pad P between the semiconductor wafer 200 and the probe card 300 faces the optical microscope 120.

Since the electrode pad P on the semiconductor wafer 200 and the probe needle 310 of the probe card 300 have the relation of plane symmetry, the operation control on the X/Y stage 110 corresponding to the position data is performed as described above so that the positions of plane symmetry of the semiconductor wafer 200 and the probe card 300 face the optical microscope 120.

In a state as described above, as shown in FIG. 1A, a pad image of a portion in which the probe needle 310 did not properly come into contact with the electrode pad P as shown in FIG. 1A and a probe image of a portion in which the probe needle 310 did not properly come into contact with the electrode pad P are captured by the CCD camera 121 respectively.

Figure 1C:
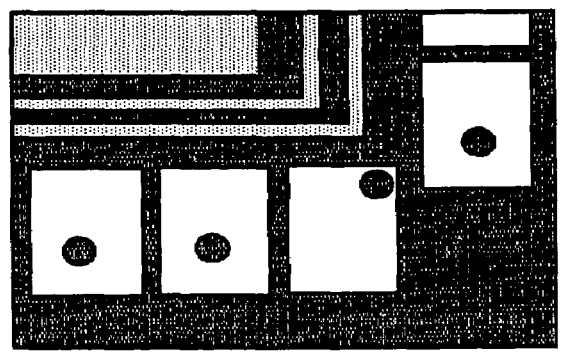
Figure 1D:
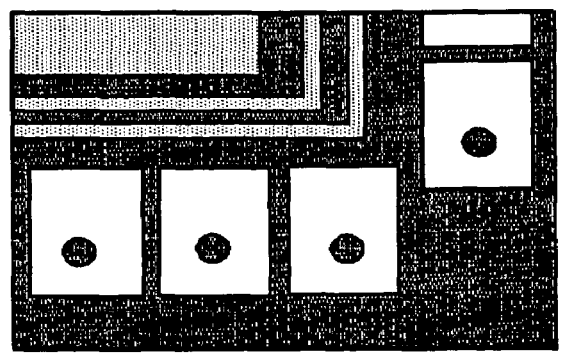

Further, the computer 130 stores the pad image captured as described above, overlays the probe image captured in a real time manner on an inverted pad image in a real time manner as shown in FIGS. 1C and 1D, and displays the resultant image on the display unit 140. In the probe test apparatus 100 of the embodiment, the computer 130 makes the pad image inverted as described above, overlays the probe image on the pad image, and displays the resultant image on the display unit 140. By the computer 130 and the display unit 140, an image processing unit is realized.

Since the display unit 140 is disposed above the rear portion of the X/Y stage 110, the X/Y stage 110 holds the probe card 300 in a position in which the display screen of the display unit 140 is visually recognized.

A method of correcting the probe card 300 by using the probe test apparatus 100 of the embodiment with the configuration as described above will be described. First, in a manner similar to the conventional technique, the probe needle 310 of the probe card 300 is pressed against the electrode pad P of the semiconductor device of the semiconductor wafer 200 by a probe apparatus (not shown) and, after that, a needle mark is tested. When an electrode pad P in which the position of the needle mark is not proper is detected, image data of the portion is recorded.

At the time of correcting the probe card 300, the position data is input to the computer 130 of the probe test apparatus 100 by a keyboard operation or the like. In the probe test apparatus 100, as shown in FIG. 5, the X/Y stage 110 is disposed in the initial position in the initial state (step S1), and the position data which is input as described above is stored in the computer 130.

When the semiconductor wafer 200 is set on the X/Y stage 110 in the initial position in such a state, for example, the state where the X/Y stage 110 holds the semiconductor wafer 200 is input to the computer 130 by sensor, keyboard operation, and the like (not shown) as a holding-member input unit (step S4).

Since the computer 130 controls the operation of the X/Y stage 110 in correspondence with position data (step S5), the portion of the electrode pad P in which the position of the needle mark is not proper on the semiconductor wafer 200 faces the optical microscope 120.

In this state, an image of the surface of the semiconductor wafer 200 is captured by the CCD camera 121 via the optical microscope 120 (step S6), the image data is stored in the computer 130 (step S7), and the pad image of the portion of the electrode pad P in which the position of the needle mark is not proper as shown in FIG. 1A is stored.

After that, the X/Y stage 110 returns to the initial position (step S8), the semiconductor wafer 200 is detached from the X/Y stage 110, and the probe card 300 is set. When the state in which the probe card 300 is held by the X/Y stage 110 is input to the computer 130 by the sensor, or the like (step S9), the computer 130 controls the operation of the X/Y stage 110 in correspondence with position data (step S10).

The portion in which the position of the needle mark is not proper in the semiconductor wafer 200 and that in the probe card 300 are positioned symmetrically with respect to a plane. The computer 130 controls the operation of the X/Y stage 110 in correspondence with whether the semiconductor wafer 200 or the probe card 300 is set. Consequently, the portion of the probe needle 310 whose needle mark position is not proper also in the probe card 300 faces the optical microscope 120.

In this state, an image of the surface of the probe card 300 is captured by the CCD camera 121 via the optical microscope 120 (step S11), and the captured probe image is displayed on the display unit 140 together with the stored pad image in a real time manner (steps S12 and S13)

At this time, the computer 130 makes the stored pad image inverted so that the probe image and the pad image are displayed in the same direction, overlays the probe image on the pad image in a real time manner. Therefore, as shown in FIG. 1C, a composite image by which the positional relation between the electrode probe P and the tip Q of the probe needle 310 can be recognized is displayed.

While visually recognizing the synthetic image displayed, the operator performs a correcting work so that the tip Q of the probe needle 310 is positioned in the center of the electrode pad P. The pad image is captured and stored in advance but the probe image is captured and displayed in a real time manner. Therefore, as shown in FIG. 1D, the operator performs the correcting work while observing the position of the tip Q of the probe needle 310 by the composite image displayed on the display unit 140 in a real time manner.

After completion of the correcting work, for example, the operator inputs the end of work to the computer 130 by keyboard operation (step S14). In response to the end of work, the probe image capturing, image combining process, and display of the composite image are finished and the X/Y stage 110 returns to the initial position (step S15). The operator takes the corrected probe card 300 out from the X/Y stage 110 in the initial position.

In the probe test apparatus 100 of the embodiment, a probe image captured in a real time manner is overlaid on an inverted pad image in a real time manner. Therefore, the operator can easily perform the correcting work while observing the state of the probe needle 310 with respect to the electrode pad P in a real time manner.

In particular, although the probe image is captured and displayed in a real time manner, the pad image is captured in advance and displayed. Therefore, the semiconductor wafer 200 and the probe card 300 are held by the single X/Y stage 110 and a pad image and a probe image can be captured by the single CCD camera 121. Thus, the structure of the probe test apparatus 100 is simple, small, and lightweight.

Further, the semiconductor wafer 200 and the probe card 300 have the relation of plane symmetry. The probe image is combined on the inverted pad image, so that the position of the electrode pad P and that of the probe needle 310 can be made correspond to each other. Consequently, the actual movement direction of the probe needle 310 to be corrected and the movement direction of the tip Q in a display image are not opposite to each other.

Moreover, the X/Y stage 110 holds the probe card 300 in a state where the probe needle 310 is positioned upward. Consequently, the operator does not have to perform the correcting work in an unreasonable posture but can easily perform a fine correcting work. Further, the X/Y stage 110 holds the probe card 300 in a position where the display screen of the display unit 140 can be visually recognized. Therefore, it is easy for the operator to perform the correcting work while observing the display image.

The pad image and the probe image are enlarged at a more accurate magnification by the optical microscope 120 and the enlarged images are captured by the CCD camera 121, so that the operator can easily perform the fine work of correcting the probe needle 310.

Since the pad image and the probe image are enlarged and the enlarged images are captured, the CCD camera 121 can capture the image of the surface of the semiconductor wafer 200 and the probe card 300 only partially. However, the semiconductor wafer 200 and the probe card 300 are moved in parallel with each other in their surfaces by the X/Y stage 110. Consequently, the CCD camera 121 can capture images of the entire surfaces of the semiconductor wafer 200 and the probe card 300.

When the position data of the portion in which the probe needle 310 does not properly come into contact with the electrode pad P is input, the operation of the X/Y stage 110 is controlled in correspondence with the position data. Therefore, an image of the portion in which the probe needle 310 does not properly come into contact with the electrode pad P in the semiconductor wafer 200 and the probe card 300 can be automatically captured by the CCD camera 121.

Moreover, the operation of the control of the X/Y stage 110 corresponding to the position data is performed in accordance with which one of the semiconductor wafer 200 and the probe card 300 is held on the X/Y stage 110. Thus, an image of a problematic portion in the semiconductor wafer 200 and the probe card 300 having the relation of plane symmetry can be accurately captured by the CCD camera 121.

The present invention is not limited to the embodiment but allows various modifications without departing from its gist. For example, in the foregoing embodiment, in a manner similar to the conventional technique, the probe needle 310 is pressed against the electrode pad P by the probe device, then the needle mark is examined. Position data of a portion in which the position of the needle mark is not proper is recorded and input to the probe test apparatus 100.

It is also possible to capture the pad images of the entire semiconductor wafer 200 in advance by the probe test apparatus 100, display the composite image while capturing probe images of the entire probe card 300, and find the probe needle 310 whose tip Q is not properly positioned in the electrode pad P.

Although the example in which the operator corrects the probe needle 310 by a manual work while observing a composite image of a pad image and a probe image has been described in the foregoing embodiment, for example, it is also possible to recognize a composite image by the computer 130 and automatically correct the probe needle 310 by a robot arm (not shown).

Further, although an example in which a composite image of a pad image and a probe image is displayed on the dedicated display unit 140 has been described above, the dedicated display unit 140 may not be used by, for example, displaying the composite image on a display unit of the computer 130. In this case as well, the work of correcting the probe needle 310 is facilitated. Thus, it is preferable to dispose the display unit (not shown) of the computer 130 in the position where it can be seen from the operator who corrects the probe card 300.

Figure 6:
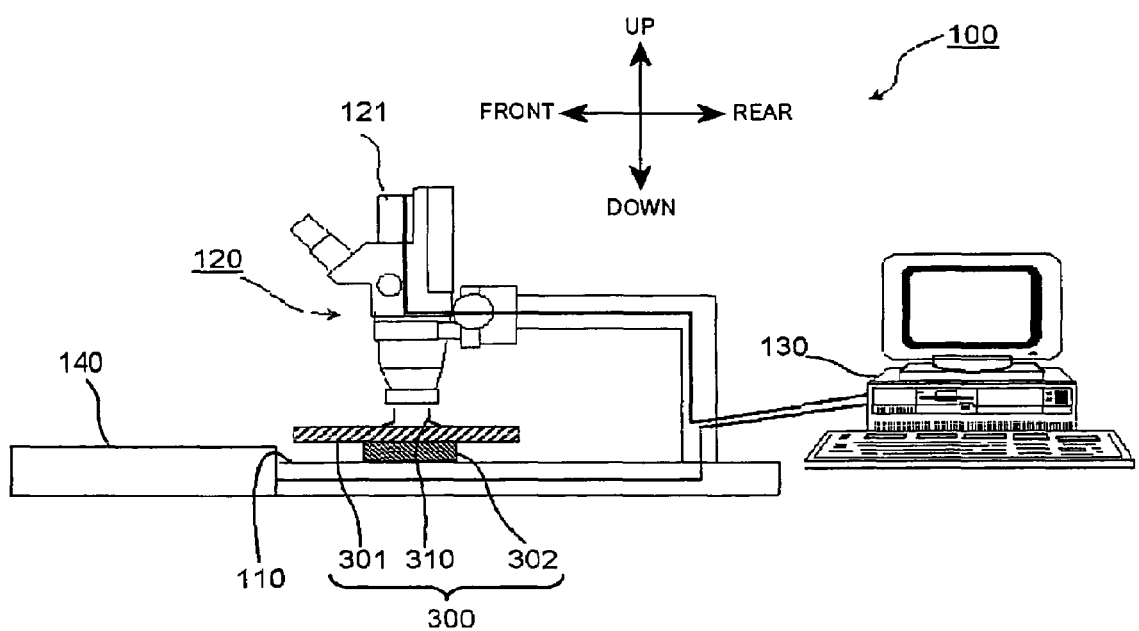
FIG. 6 is a schematic side view showing the structure of a probe test apparatus of a modification.

The example in which the operator corrects the probe needle 310 of the probe card 300 disposed horizontally while observing the screen of the display unit 140 disposed perpendicularly has been described in the foregoing embodiment. It is also possible to dispose the display unit 140 horizontally in front of or on the side of (not shown)the X/Y stage 110 as shown in FIG. 6. In this case, the device occupying area increases but the actual movement direction of the probe needle 310 to be corrected and the movement direction of the probe needle 310 in an image coincide with each other. Therefore, the correcting work can be performed more intuitively.

Further, the example of holding the semiconductor wafer 200 and the probe card 300 on the single X/Y stage 110 and capturing the pad images and probe images by the single CCD camera 121 has been described in the foregoing embodiment. For example, it is also possible to separately hold the semiconductor wafer 200 and the probe card 300 by two X/Y stages and capture the pad image and the probe image by two CCD cameras (not shown). In this case, the scale of the probe test apparatus increases but the capturing of the pad image and that of the probe image can be performed simultaneously. Thus, the work time can be shortened.

In the embodiment, to make the description simpler, the example in which the probe image perfectly synchronized with the pad image by using the position data is automatically captured has been described. For example, in the case where the probe image captured is not perfectly synchronized with the pad image by using the position data, it is also possible to adjust the image capturing position of the probe image by a manual work or image recognition.

Further, in the foregoing embodiment, the optical microscope 120 and the CCD camera 121 are fixed and the semiconductor wafer 200 and the probe card 300 are moved by the X/Y stage 110. For example, it is also possible to fix the semiconductor wafer 200 and the probe card 300 in terms of position and move the optical microscope 120 and the CCD camera 121 (not shown). It is also possible to move the semiconductor wafer 200 and the probe card 300 in one of X and Y directions and move the optical microscope 120 and the CCD camera 121 in the other direction thereof (not shown).

In the embodiment, to make the description simpler, the example in which one pad image and one probe image are captured in response to an input of a piece of position data has been described. For example, it is also possible to capture a plurality of pad images and a plurality of probe images in response to input of a plurality of pieces of position data.

Further, in the embodiment, the pad image and the probe image are simply overlaid, and a composite image is displayed. To facilitate the work of correcting the probe needle 310, for example, it is also possible to display the pad image in blue and the probe image in red, display the pad image semitransparent and the probe image clearly, emphasize the contour of the electrode pad P in the pad image by image process, emphasize the tip Q of the probe needle 310 in the probe image by image process, individually turn on/off display of the pad image and the probe image by a manual operation, and individually adjust the display density of the pad image and the probe image by a manual operation.

In the case of using a wafer having a pad pattern which is the same as that of a wafer used before, it is unnecessary to newly capture an image of the wafer and store pad images. A probe test can be appropriately performed using the stored pad data.

SECOND EMBODIMENT

A second embodiment according to the present invention will be described below with reference to the drawings. The embodiment is different from the first embodiment with respect to the point that a pad image is set on the basis of position coordinate data of a predetermined probe needle. Therefore, the wafer holding unit and the wafer image capturing unit in the first embodiment are not provided.

A method of correcting the probe card 300 using the probe test apparatus 100 of the embodiment with the configuration will be described below.

Figure 7A:
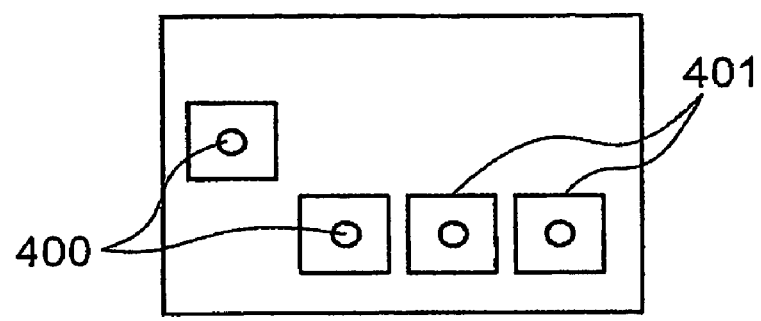
FIGS. 7A to 7D are schematic front views showing a display image of a probe test apparatus of a second embodiment.

First, a pad layout image is set on the basis of position coordinate data of a probe needle and stored in the computer 130. For example, as shown in FIG. 7A, target probe needle positions 400 are led from the position coordinate data of the probe needle, and probing areas 401 each using the target probe needle position 400 as a center are set. The probing area 401 is a permissible range of the contact position of the probe needle on the pad. The image of the probing area can be set by using known software for drawing an image on the computer 130.

The pad layout image does not always have the same size and shape as that of an actual pad as long as a proper position of the probe needle can be recognized.

Next, as shown in FIG. 6, the probe card 300 to be tested is set on the X/Y stage 110 of the probe test apparatus 100.

Figure 7B:
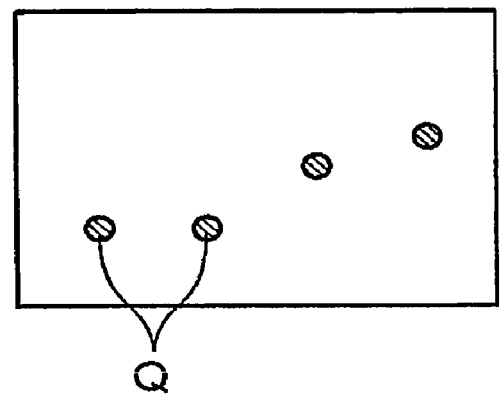

In this state, as shown in FIG. 7B, an image of the surface of the probe card 300 is captured by the CCD camera 121 via the optical microscope 120. The captured probe image is displayed on the display unit 140 in a real time manner together with the pre-stored pad layout image.

Figure 7C:
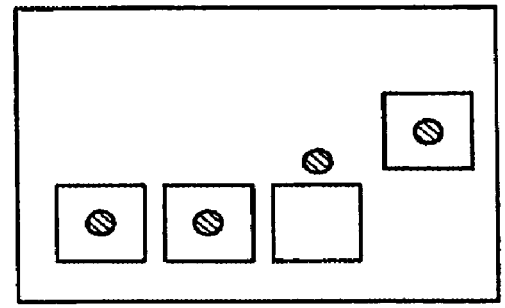

The computer 130 makes the pad layout image inverted and overlays the probe image on the pad layout image so that the probe image overlaid in the same direction on the pre-stored pad layout image is displayed. Therefore, as shown in FIG. 7C, a composite image by which the positional relation between the probe image (tips Q) and the pre-stored pad layout image can be recognized is displayed. Since it is important to display the probe image and the pad image overlaid in the same direction, the pad layout image may be displayed as it is, and the probe image may be inverted and overlaid on the pad layout image.

In FIG. 7C, as the pad layout image, the probing areas 401 each as the permissible range of the constant position is set. Therefore, while observing the displayed composite image, the operator performs the correcting work so that the tip Q of the probe needle out of the probing area 401 (the second probe needle tip from the right in FIG. 7C) is positioned in the probing area 401.

Figure 7D:
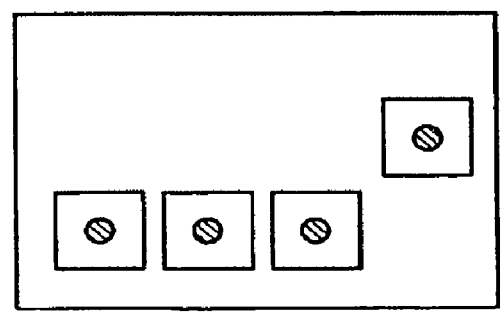
Figure 8:
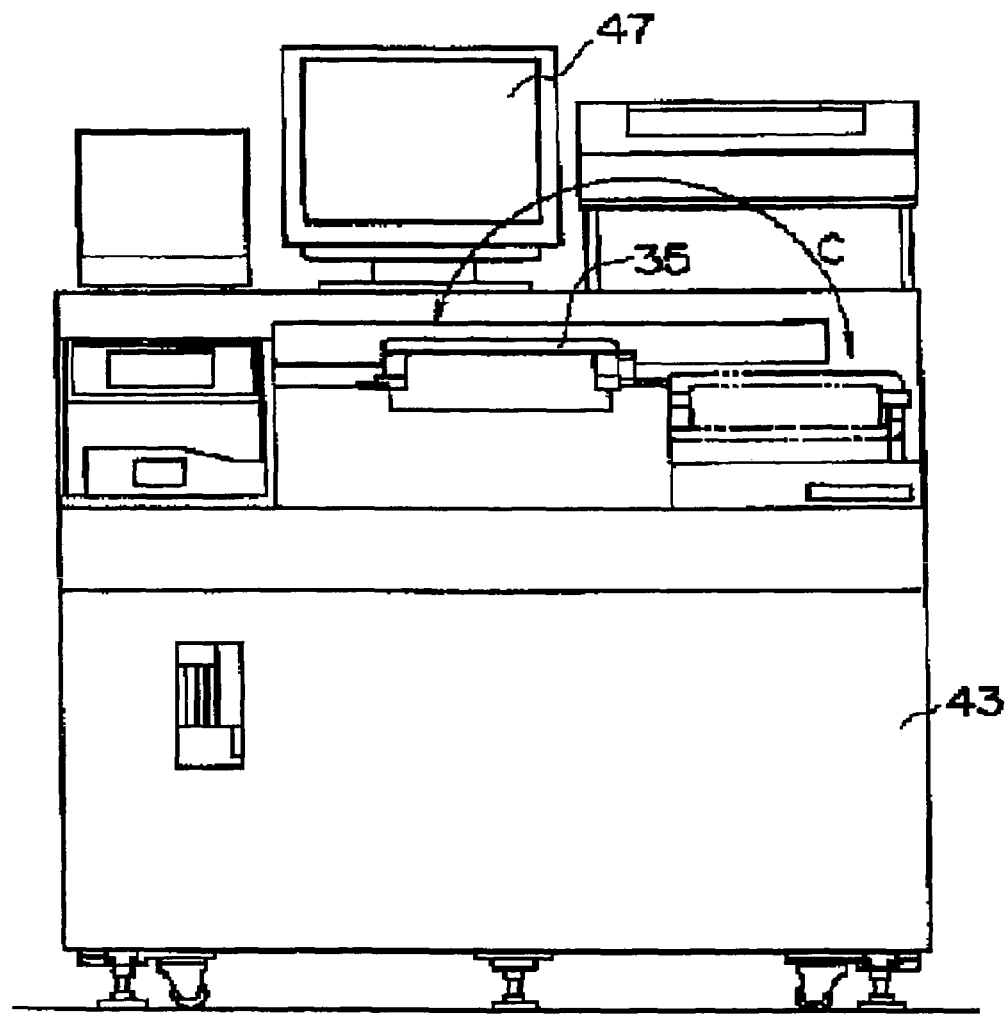
FIG. 8 is a front view showing the appearance of an entire probe apparatus as a first conventional technique.
Figure 9:
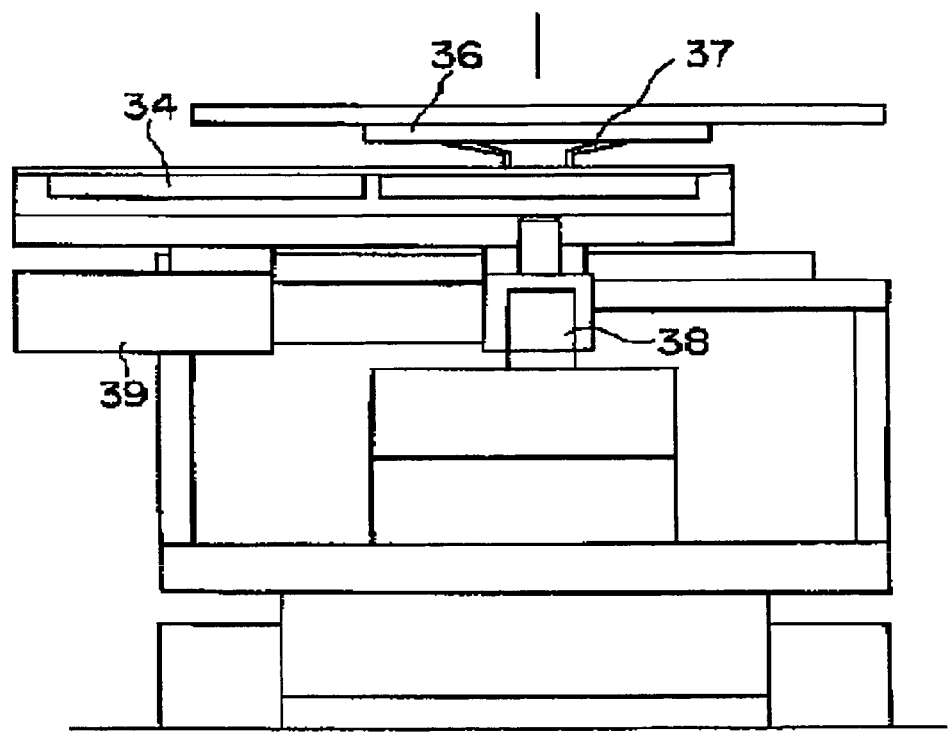
FIG. 9 is a schematic view showing the structure of main parts of a probe test apparatus.
Figure 10:
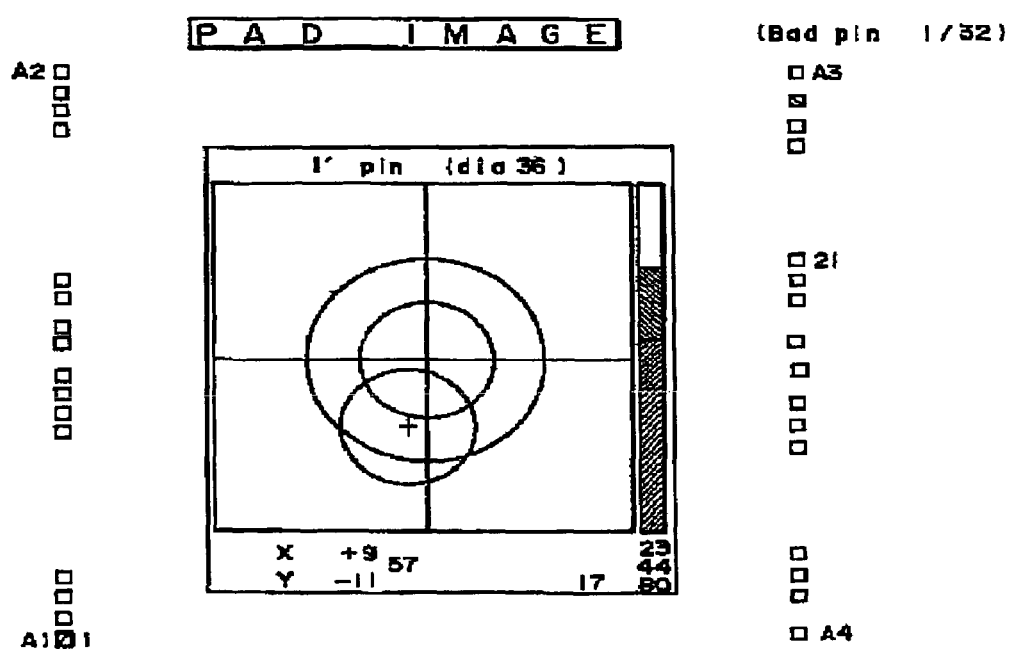
FIG. 10 is a front view showing a display image of a needle point.
Figure 11:
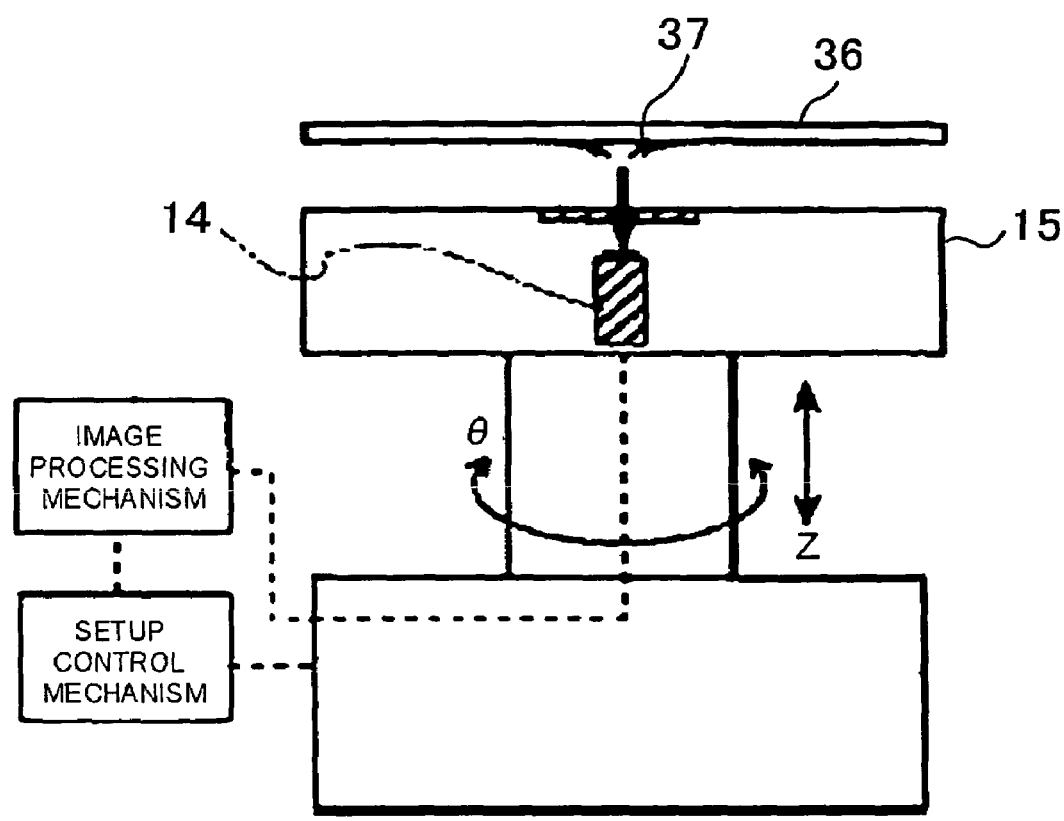
FIG. 11 is a schematic front view showing the appearance of an entire probe test apparatus as a second conventional technique.
Figure 12:
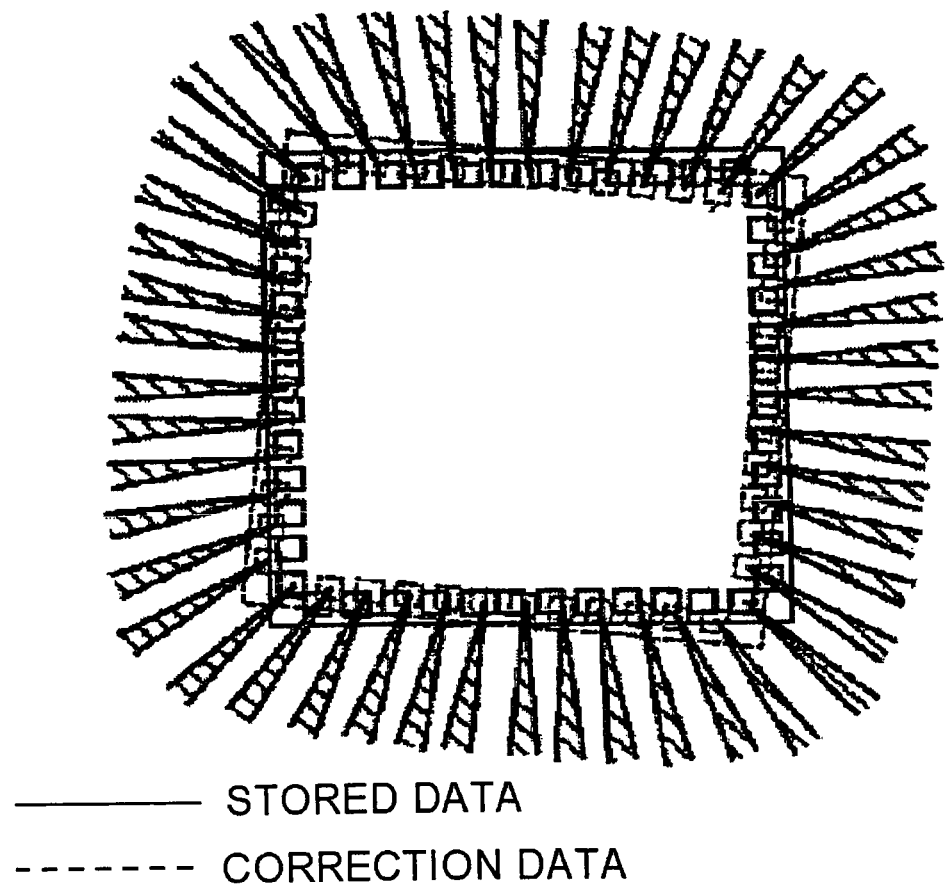
FIG. 12 is a front view showing a display image of needle points.
Figure 13:
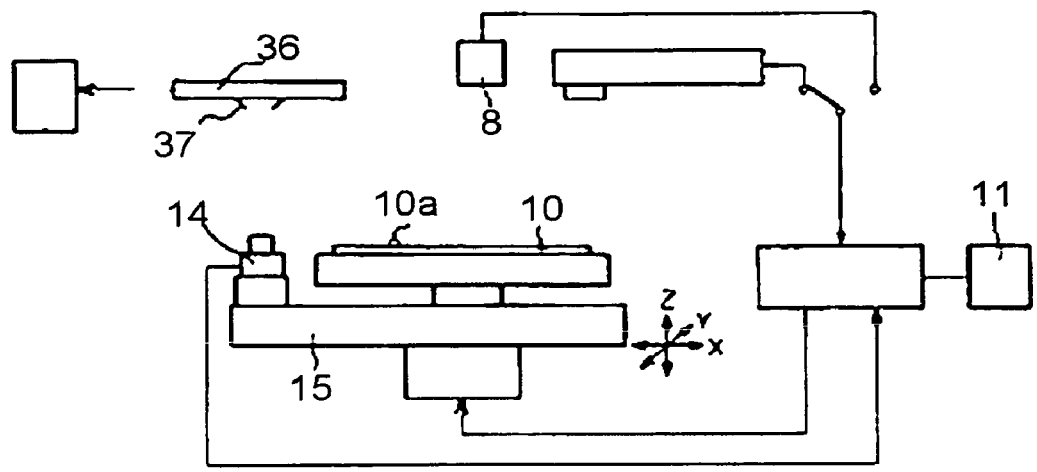
FIG. 13 is a schematic diagram showing an entire probe test apparatus as a third conventional technique.
Figure 14A:
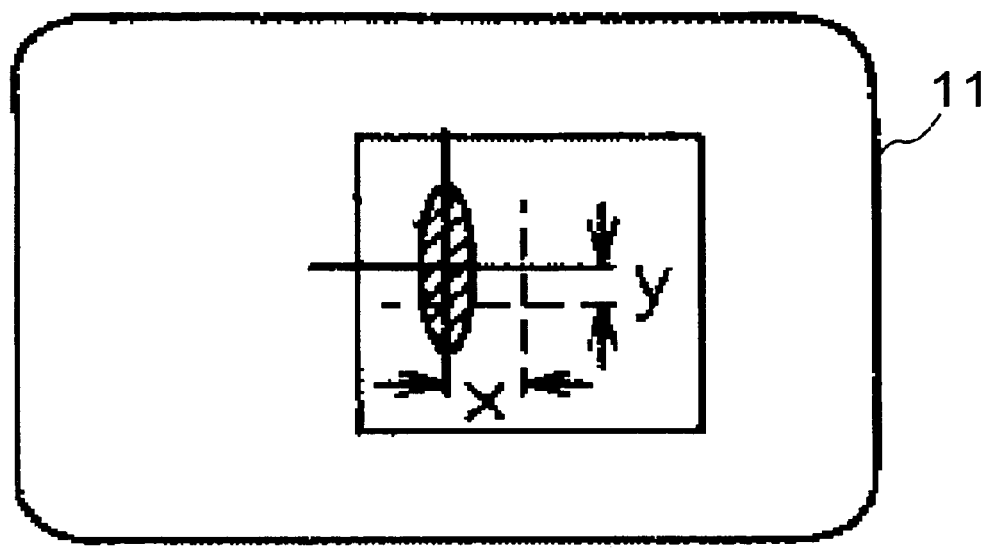
FIGS. 14A and 14B are front views showing display images of a needle point.
Figure 14B:
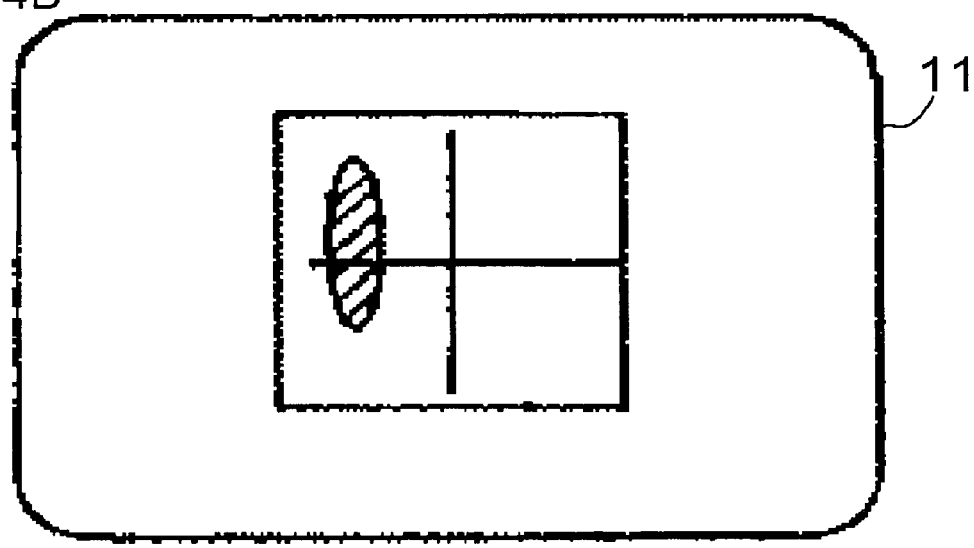

At this time, the probing area 401 is pre-stored but the probe image is captured and displayed in a real time manner. Consequently, as shown in FIG. 7D, the operator performs the correcting work while observing the position of the tip Q of the probe needle 310 in the composite image displayed on the display unit 140 in a real time manner.

As described above, in the second embodiment, in a manner similar to the first embodiment, the probe image captured in a real time manner is displayed so as to be overlaid on the pre-stored pad layout image. Consequently, the operator can easily perform the correcting work while recognizing the state of the probe needle 310 with respect to the electrode pad P in a real time manner.

In the embodiment, the pad layout image is obtained from the position coordinate data of the probe needle. Alternatively, a photograph of the tips of probe needles arranged in proper positions may be captured in advance by using an unused probe card and employed in place of the pad layout image. The probe card is set so as to face upward on the X/Y stage 110 of the probe test apparatus 100, and a photograph of the tip positions of probe needles is captured and stored in the computer 130. In this case, since the pad layout image is captured in the same direction as that of the probe needle to be corrected, it is unnecessary to invert the pad layout image at the time of displaying both of the images in an overlaid state.

It is apparent that the present invention is not limited to the above embodiment, that may be modified and changed without departing from the scope and spirit of the invention.

What is claimed is:

1. A probe test apparatus comprising:
a pad layout image storing unit that stores a pad layout image on a permanent storage device for later retrieval;
a card holding unit that holds a probe card having a surface on which probe needles are arranged in a state where said probe needles are positioned upward;
a probe image capturing unit that captures a probe image, in a real time manner, by which the position of the tip of each of said probe needles can be specified from said probe card held; and
an image processing unit that displays said pad layout image retrieved from the permanent storage device and said probe image which are overlaid in the same direction,
wherein said pad layout image storing unit comprises:
a wafer holding unit that holds a semiconductor wafer having a surface on which a semiconductor device having an electrode pad is formed; and
a wafer image capturing unit that captures a pad image by which the position of said electrode pad can be specified from said semiconductor wafer held,
wherein said wafer image capturing unit captures an image of the surface of said semiconductor wafer partially,
said probe image capturing unit captures an image of the surface of said probe card partially, and
the apparatus further comprises a wafer moving unit that moves at least one of said wafer image capturing unit and said wafer holding unit in parallel with the surface of said semiconductor wafer, and
a card moving unit that moves at least one of said probe image capturing unit and said card holding unit in parallel with the surface of said probe card,
wherein said wafer image capturing unit and said probe image capturing unit are made by a single image capturing device, and
said wafer holding unit, said card holding unit, said wafer moving unit, and said card moving unit are made by a single X/Y stage.

2. The probe test apparatus according to claim 1, wherein said pad layout image is set on the basis of position coordinate data of said probe needle.

3. The probe test apparatus according to claim 1, wherein said pad layout image is obtained by capturing the image of the tips of probe needles arranged in proper positions.

4. The probe test apparatus according to claim 1, wherein said card holding unit holds said probe card in a position where a display screen of the image processing unit is visually recognized.

5. The probe test apparatus according to claim 1, further comprising:
a position input unit to which position data of a part in which said probe needle does not properly come into contact with said electrode pad is input; and
a movement control unit that controls the operation of said wafer moving unit and said card moving unit in accordance with said position data input.

6. A probe test apparatus comprising:
a pad layout image storing unit that stores a pad layout image on a permanent storage device for later retrieval;
a card holding unit that holds a probe card having a surface on which probe needles are arranged in a state where said probe needles are positioned upward;
a probe image capturing unit that captures a probe image, in a real time manner, by which the position of the tip of each of said probe needles can be specified from said probe card held;
an image processing unit that displays said pad lay out image retrieved from the permanent storage device and said probe image which are overlaid in the same direction;
a position input unit to which position data of a part in which said probe needle does not properly come into contact with said electrode pad is input; and
a movement control unit that controls the operation of said wafer moving unit and said card moving unit in accordance with said position data input,
wherein said pad layout image storing unit comprises:
a wafer holding unit that holds a semiconductor wafer having a surface on which a semiconductor device having an electrode pad is formed; and
a wafer image capturing unit that captures a pad image by which the position of said electrode pad can be specified from said semiconductor wafer held, wherein said wafer image capturing unit captures an image of the surface of said semiconductor wafer partially, said probe image capturing unit captures an image of the surface of said probe card partially, and the apparatus further comprises a wafer moving unit that moves at least one of said wafer image capturing unit and said wafer holding unit in parallel with the surface of said semiconductor wafer, and a card moving unit that moves at least one of said probe image capturing unit and said card holding unit in parallel with the surface of said probe card, wherein said wafer image capturing unit and said probe image capturing unit are made by a single image capturing device, said wafer holding unit, said card holding unit, said wafer moving unit, and said card moving unit are made by a single X/Y stage, the apparatus also comprises a holding member input unit to which data indicative which one of said semiconductor wafer and said probe card is held on said X/Y stage, is input, and said movement control unit performs an operation control of said X/Y stage corresponding to said position data in accordance with which one of said semiconductor wafer and said probe card is held.

* * * * *